US006974982B2

(12) United States Patent
Miura

(10) Patent No.: US 6,974,982 B2
(45) Date of Patent: Dec. 13, 2005

(54) METHOD OF MANUFACTURING SEMICONDUCTOR DEVICE AND SEMICONDUCTOR DEVICE

(75) Inventor: Noriyuki Miura, Kanagawa (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/913,430

(22) Filed: Aug. 9, 2004

(65) Prior Publication Data

US 2005/0014336 A1    Jan. 20, 2005

Related U.S. Application Data

(62) Division of application No. 10/092,499, filed on Mar. 8, 2002, now Pat. No. 6,825,074.

(30) Foreign Application Priority Data

Mar. 12, 2001  (JP)  .............................. 2001-068895

(51) Int. Cl.[7] .............................................. H01L 29/76
(52) U.S. Cl. ...................... 257/288; 438/311; 438/197
(58) Field of Search .......................... 438/257, 311, 197

(56) References Cited

U.S. PATENT DOCUMENTS 6,495,898 B1   12/2002  Iwamatsu et al.
6,627,505 B2 *  9/2003  Adan .......................... 438/311

OTHER PUBLICATIONS

Jeffrey W. Thomas et al., "Characteristics of Submicrometer LOCOS Isolation", 1995 IEEE International SOI Conferences, Oct. 1995, pp. 116-117.

* cited by examiner

Primary Examiner—Thao P. Le
(74) Attorney, Agent, or Firm—Volentine Francos & Whitt, PLLC

(57) ABSTRACT

Impurity ions are implanted into the silicon layer of an SOI substrate to achieve an ion concentration distribution which inhibits for a reduction in threshold voltage (Vth-rolloff) as a gate length is reduced. A reduction in potential barrier which runs from a drain region side is effectively inhibited to counter short channel effects resulting from a reduction in gate length attendant with miniaturization of SOI-MOSFETs.

3 Claims, 16 Drawing Sheets

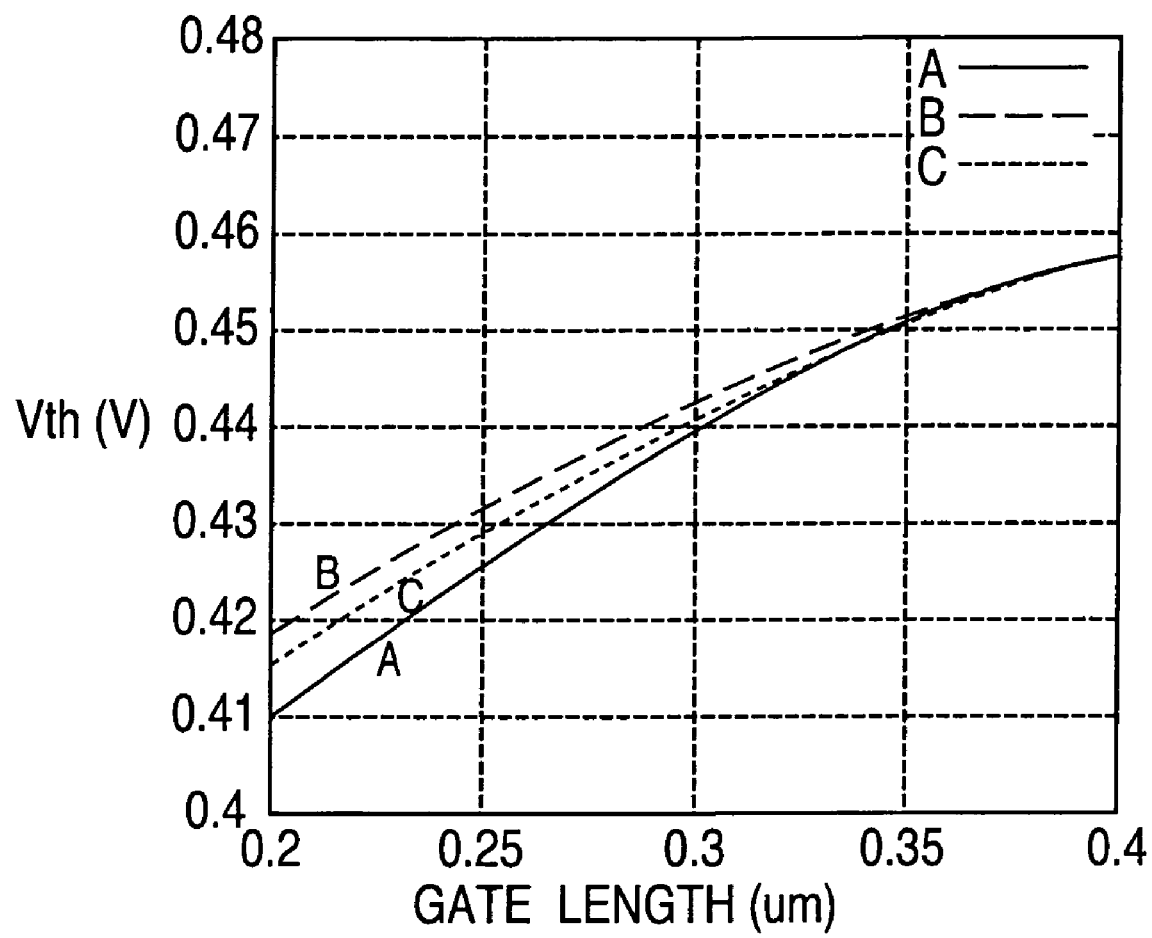

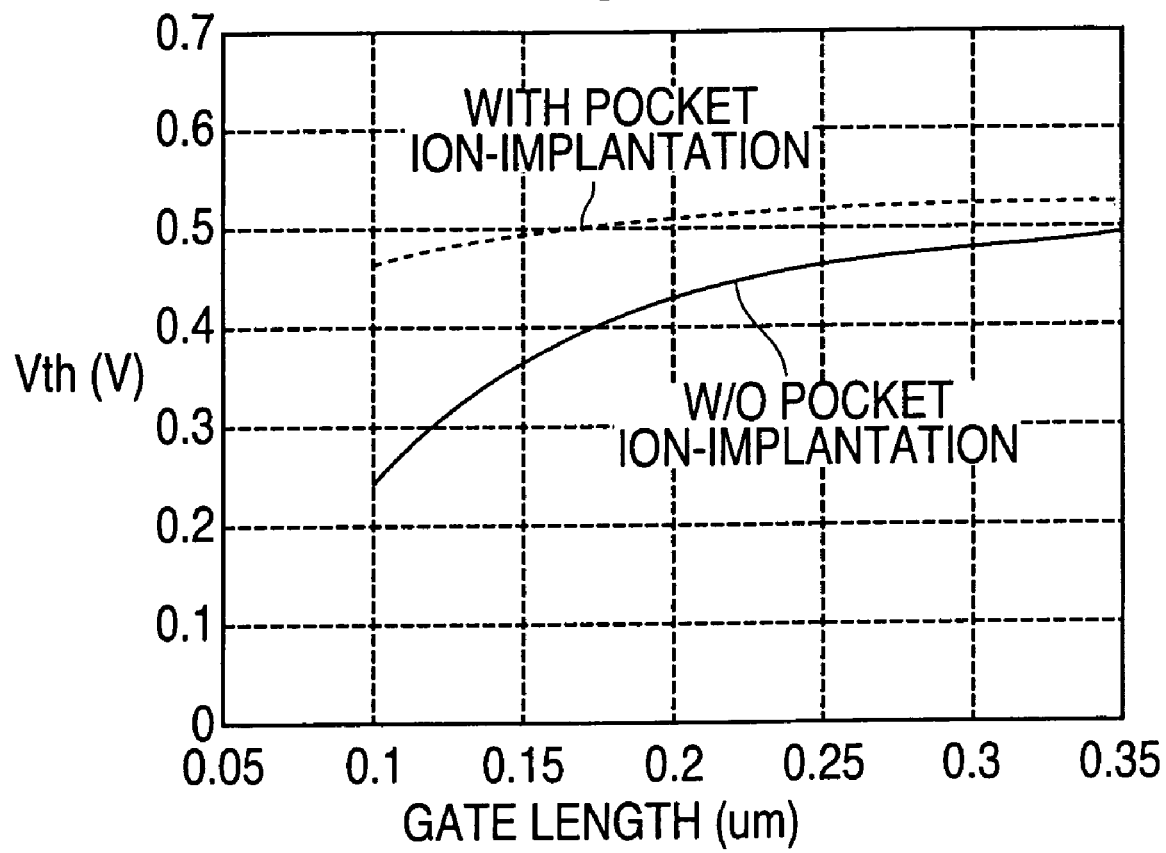

METHOD OF MANUFACTURING SEMICONDUCTOR DEVICE AND SEMICONDUCTOR DEVICE

CROSS-REFERENCE TO RELATED APPLICATIONS

This is a divisional of application Ser. No. 10/092,499, filed Mar. 8, 2002, now U.S. Pat. No. 6,825,074 which is incorporated herein by reference in its entirety.

BACKGROUND OF THE INVENTION

1. Field of the Invention

The present invention relates to a method of manufacturing a MOSFET which is formed in a silicon on insulator (SOI) substrate, and more particularly to a method of implanting ions into a silicon layer of the SOI substrate to control a threshold voltage of the SOI-MOSFET. And, the present invention relates to a semiconductor device which is formed in the SOI substrate, and more particularly to a peak ion concentration of the silicon layer of the SOI-MOSFET.

The present application claims priority under 35 U.S.C. §119 to Japanese Patent Application No. 2001-68895, filed Mar. 12, 2001, which is herein incorporated by reference in its entirely for all purposes.

2. Description of the Related Art

A conventional method of manufacturing a semiconductor device will be described below with reference to the cross-sectional views of FIGS. 19(a) through 19(f) and FIGS. 20(a) through 20(c).

At first, an SOI substrate 501 is prepared having a silicon substrate 500, an oxide film 502 and an SOI layer 504, as shown in FIG. 19(a). A pad oxide film 506 is formed on the SOI layer 504, as shown in FIG. 19(b), and then a nitride film ($Si_3N_4$) 508 is formed on the pad oxide film 506, as shown in FIG. 19(c).

Then, an isolation film 503 is formed by a local oxidation (LOCOS) method or a shallow trench isolation (STI) method, as shown in FIG. 19(d). Thereafter, the pad oxide film 506 is removed, as shown in FIG. 19(e), and then a thin oxide film 510 is formed on the SOI layer 504, as shown in FIG. 19(f). A thickness of the thin oxide film 510 may be less than 10 nm.

Then, impurity ions 512 are implanted into the SOI layer 504, as shown in FIG. 20(a). In the n-type SOI-MOSFET, a p-type impurity ion is implanted, and in the p-type SOI-MOSFET, an n-type impurity ion is implanted. Then, a gate electrode 514 is formed on the thin oxide film, as shown in FIG. 20(b). The gate electrode 514 is composed of a poly-silicon, for example. Finally, lightly doped drain (LDD) regions which includes source and drain regions 516 are formed with the use of side walls 518, as shown in FIG. 20(c).

FIG. 21 is a graph for illustrating the relationship between a gate length and a threshold voltage of the conventional SOI-MOSFET. As the gate length of the SOI-MOSFET is reduced from 0.5 μm, the threshold voltage of the device gradually falls. However, as the gate length is reduced even further, the fall in the threshold voltage becomes more pronounced, until eventually small reductions in gate length result in large drops in the threshold voltage. This is known as a "short channel effect". As such when the gate length of the SOI-MOSFET is designed to be about 0.35 μm, the threshold voltage does not vary to any great extent as a result of manufacturing variation in the gate length. However, when the gate length is designed to be less than 0.15 μm, the threshold voltage can exhibit wide variation even with only small variation in the manufactured gate length.

FIG. 22 is a graph for illustrating the relationship between a gate length and a sub-threshold coefficient of the conventional SOI-MOSFET. As the gate length of the SOI-MOSFET is reduced from 0.5 μm, the sub-threshold coefficient S (mV/dec.) gradually rises. However, as the gate length is reduced even further, the rise in the sub-threshold coefficient S becomes more pronounced, until eventually small reductions in gate length result in large increases in the sub-threshold coefficient S. Also, the larger the sub-threshold coefficient S, the larger becomes an off-leak current. As such, small reductions in gate length can result in large increases in the sub-threshold coefficient S and in the off-leak current.

FIGS. 23(a) and 23(b) are graphs for illustrating relationships between a thickness of the SOI layer and a threshold voltage of the conventional SOI-MOSFET when the SOI-MOSFET has two kinds of gate length. It is known a relatively thin SOI layer to help mitigate the short channel effect. However, if the SOI layer is too thin, the threshold voltage suddenly falls off, as shown in FIGS. 23(a) and 23(b).

The conventional SOI-MOSFET is disclosed in an article of Proceeding 1995 IEEE International SOI Conference, October 1995, pp. 116–117, "Characteristics of Submicrometer LOCOS Isolation", published on October, 1995.

SUMMARY OF THE INVENTION

It is an objective of the invention to provide a method of manufacturing a semiconductor device and a semiconductor device so as to effectively inhibit the short channel effect resulting from a reduction of the gate length attendant with miniaturization of the SOI-MOSFET.

To achieve this object, in a method of manufacturing a semiconductor device and a semiconductor device, impurity ions are implanted into the SOI layer so that a distribution of an impurity ion concentration in the SOI layer inhibits a reduction in a threshold voltage (Vth-rolloff) of the device.

According to the present invention, a reduction in a potential barrier can be effectively inhibited, which in turn can effectively inhibit the short channel effect resulting from a reduction in the gate length.

The above and further objects and novel features of the invention will more fully appear from the following detailed description, appended claims and accompanying drawings.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

FIG. 5 is a diagram showing the relationship between a gate length and a threshold voltage of an SOI-MOSFET, for each of the three distributions of the ion concentration shown in FIG. 4;

FIG. 12 is a diagram showing relationships between a gate length and a threshold voltage when the ion-implantation is performed by the pocket ion-implantation and is not performed by the same, respectively;

DETAILED DESCRIPTION OF THE PREFERRED EMBODIMENTS

Preferred embodiments of the present invention will hereinafter be described in detail with reference to the accompanying drawings. The drawings used for this description typically illustrate major characteristic parts in order that the present invention will be easily understood.

Figure 1A:
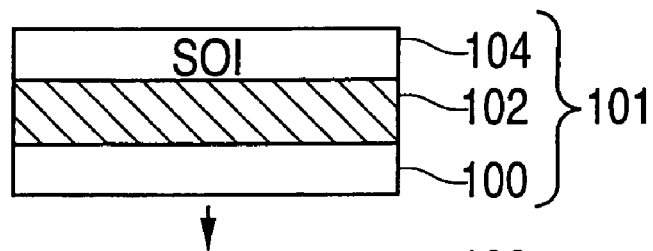
FIGS. 1(a) through 1(f) and FIGS. 2(a) through 2(c) are cross-sectional views for explaining a method of manufacturing a semiconductor device according to a first preferred embodiment of the present invention.
Figure 1B:
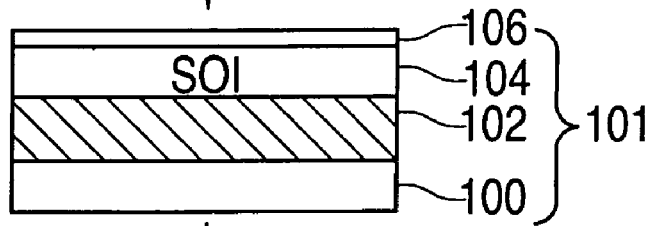
Figure 1C:
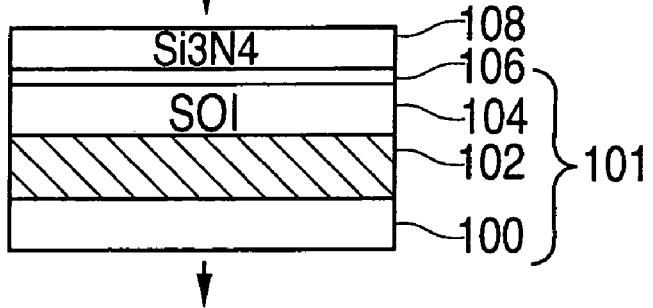
Figure 1D:
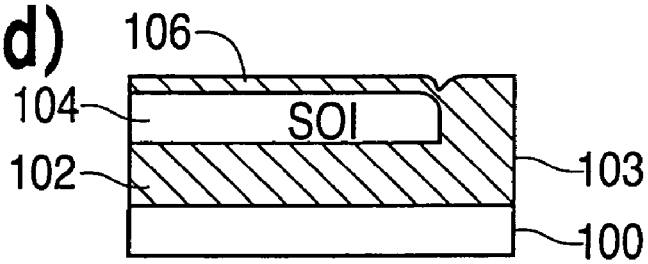
Figure 1E:
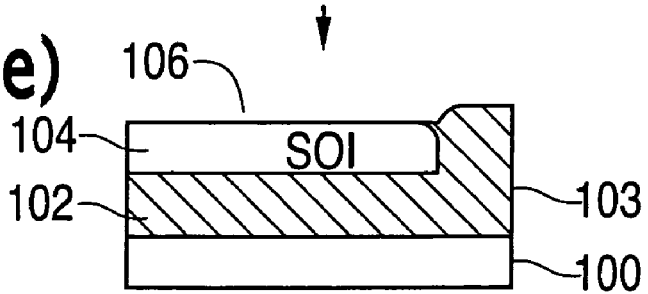
Figure 1F:
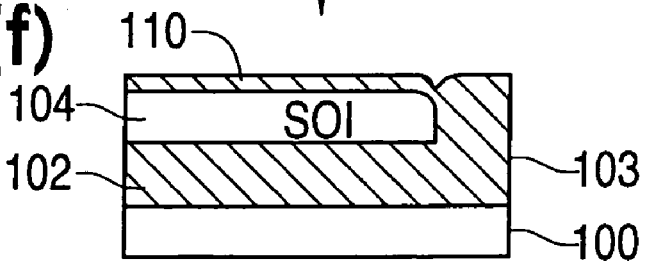

FIGS. 1(a) through 1(f) and FIGS. 2(a) through 2(c) are cross-sectional views for explaining a method of manufacturing a semiconductor device according to a first preferred embodiment of the present invention. An SOI substrate 101 is first prepared which includes a silicon substrate 100, an oxide film 102 and an SOI layer 104, as shown in FIG. 1(a). A pad oxide film 106 is formed on the SOI layer 104, as shown in FIG. 1(b), and then a nitride film ($Si_3N_4$) 108 is formed on the pad oxide film 106, as shown in FIG. 1(c). Then, an isolation film 103 is formed by a LOCOS method or an STI method, as shown in FIG. 1(d). Thereafter, the pad oxide film 106 is removed, as shown in FIG. 1(e), and then a thin oxide film 110 is formed on the SOI layer 104, as shown in FIG. 1(f). A thickness of the thin oxide film 10 may be less than 10 nm.

Figure 2A:
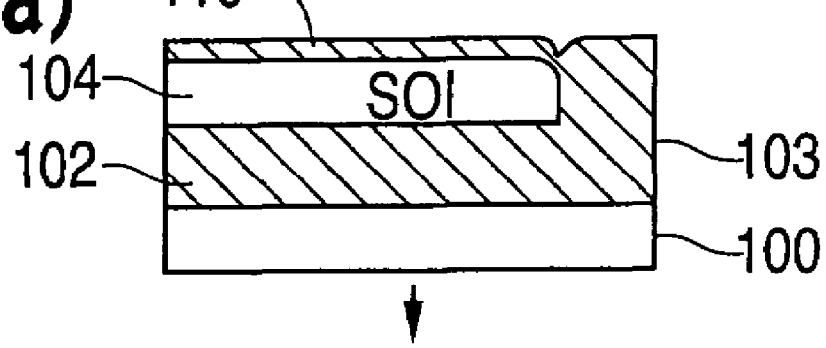

Then, as shown in FIG. 2(a), impurity ions 112 are implanted into the SOI layer 104.

Figure 3:
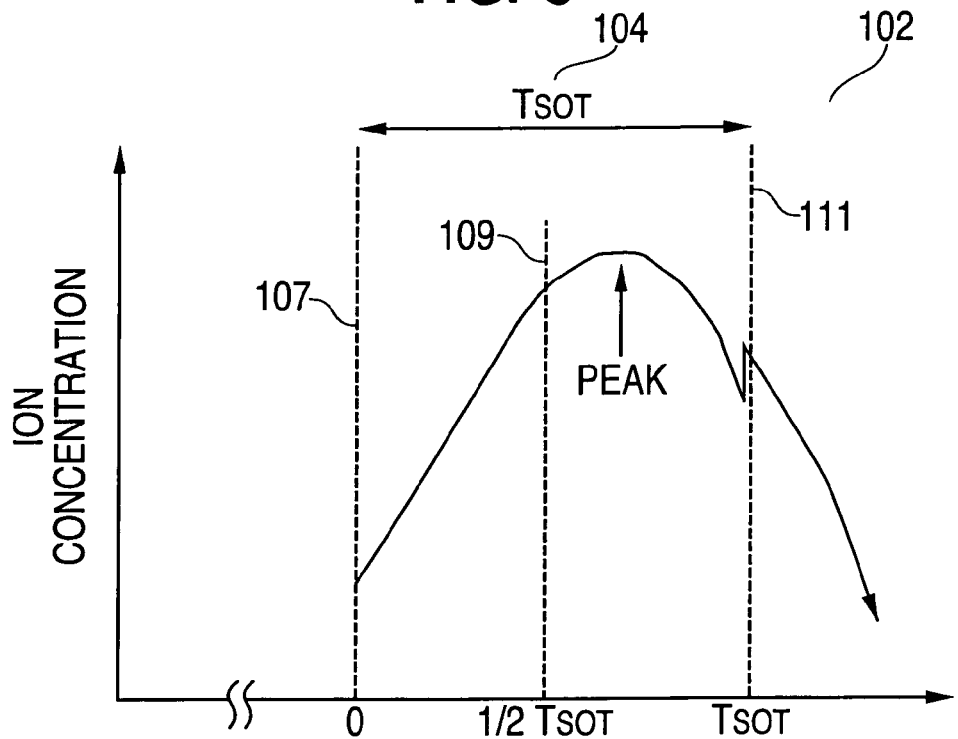
FIG. 3 is a diagram showing a distribution of an ion concentration according to the first preferred embodiment.

FIG. 3 is a diagram showing a distribution of an ion concentration of the impurity ions 112 implanted into the SOI layer 104. A p-type impurity ion is implanted when the SOI-MOSFET is an n-type device. An n-type impurity ion is implanted when the SOI-MOSFET is a p-type device. The threshold voltage of the SOI-MOSFET is controlled by characteristics of the ion-implantation. That is, the first preferred embodiment is characterized by the distribution of the ion concentration of the impurity ions 112 implanted into the SOI layer 104. Particularly, the distribution of the ion concentration is set such that a peak ion concentration is located at or between an intermediate horizontal plane 109 (½ Tsoi) and a bottom surface 111 (Tsoi) of the SOI layer 104, where Tsoi is a depth of the SOI layer 104. The intermediate horizontal plane 109 (½ Tsoi) is a horizontal plane extending halfway between top and bottom surfaces 107, 111 of the SOI layer 104. The distribution of the ion concentration is set such that the peak ion concentration is located at or between the intermediate horizontal plane 109 (½ Tsoi) and the bottom surface 111 (Tsoi) of the SOI layer 104.

Figure 2B:
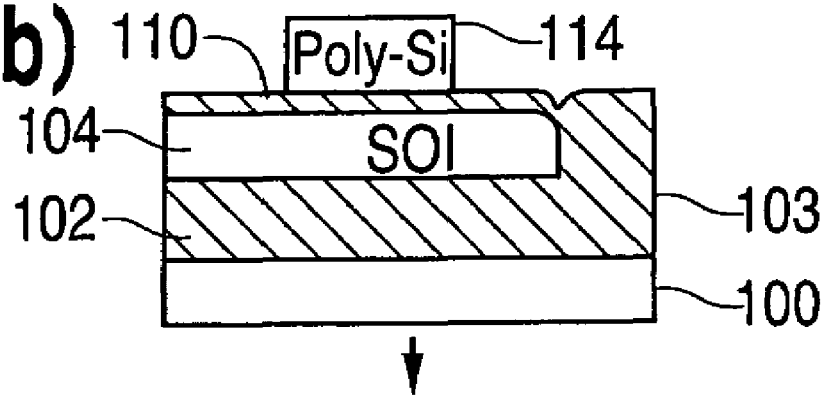
Figure 2C:
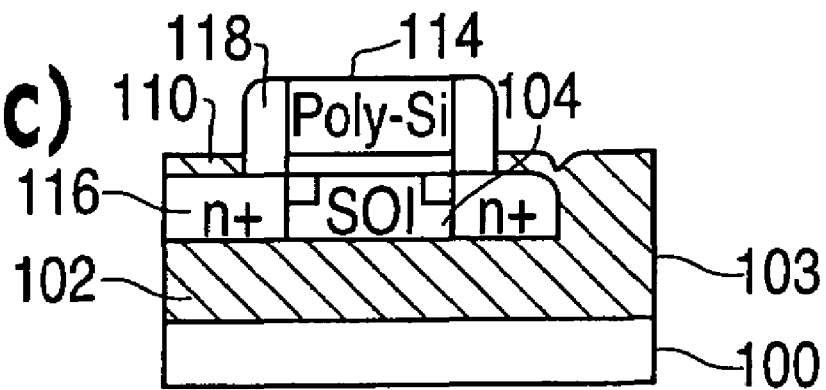

Then, a gate electrode 114 is formed on the thin oxide film 106, as shown in FIG. 2(b). The gate electrode 114 is composed of a poly-silicon, for example. Finally, lightly doped drain (LDD) regions which include source and drain regions 116 are formed with the use of side walls 118, as shown in FIG. 2(c).

Figure 4:
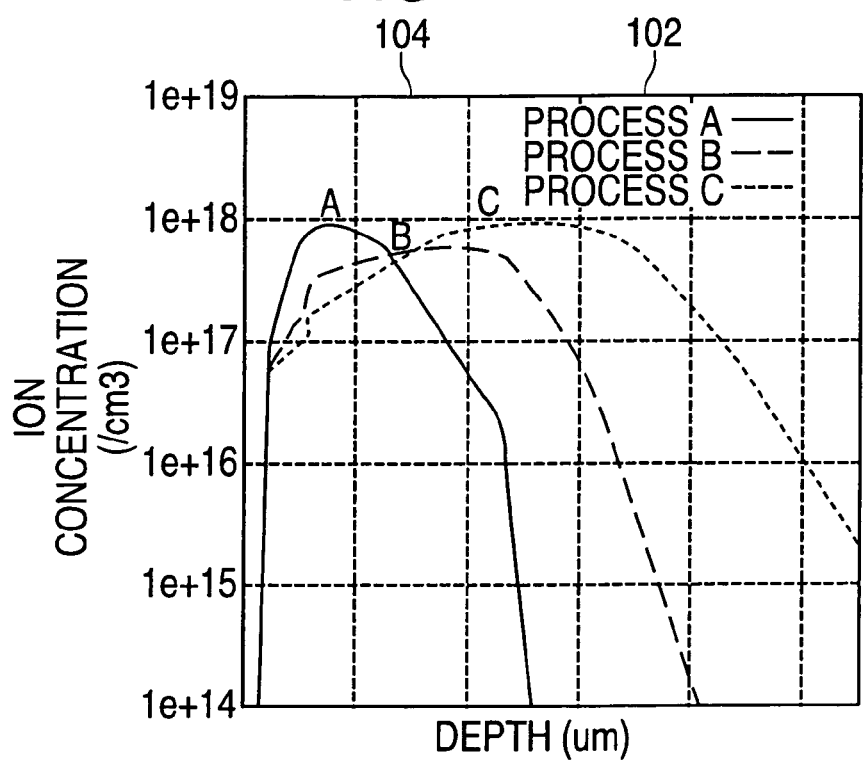
FIG. 4 is a diagram showing three distributions of the ion concentration in which the peak ion concentrations are different from one another.

FIG. 4 is a diagram showing three distributions of the ion concentration in which the peak ion concentrations are different from one another. A curve A (Process A) shows the case where the peak ion concentration is located near the top surface 107 of the SOI layer 104. A curve B (Process B) shows the case where the peak ion concentration is located between the intermediate horizontal plane 109 (½ Tsoi) and the bottom surface 111 (Tsoi) of the SOI layer 104. A curve C (Process C) shows the case where the peak ion concentration is located below the bottom surface 111 (Tsoi) of the SOI layer 104.

FIG. 5 is a diagram showing a relationship between a gate length and a threshold voltage Vth of an SOI-MOSFET, for each of the three distributions of ion concentration shown in FIG. 4. Similarly the conventional SOI-MOSFET, each of curves A, B and C shows that as the gate length of the SOI-MOSFET is shortened, the threshold voltage Vth gradually falls. However, the reduction in the threshold voltage Vth (Vth-rolloff) is the smallest for curve B. Where the peak ion concentration is located at or between the intermediate horizontal plane 109 (½ Tsoi) and the bottom surface 111 (Tsoi) of the SOI layer 104.

Figure 6A:
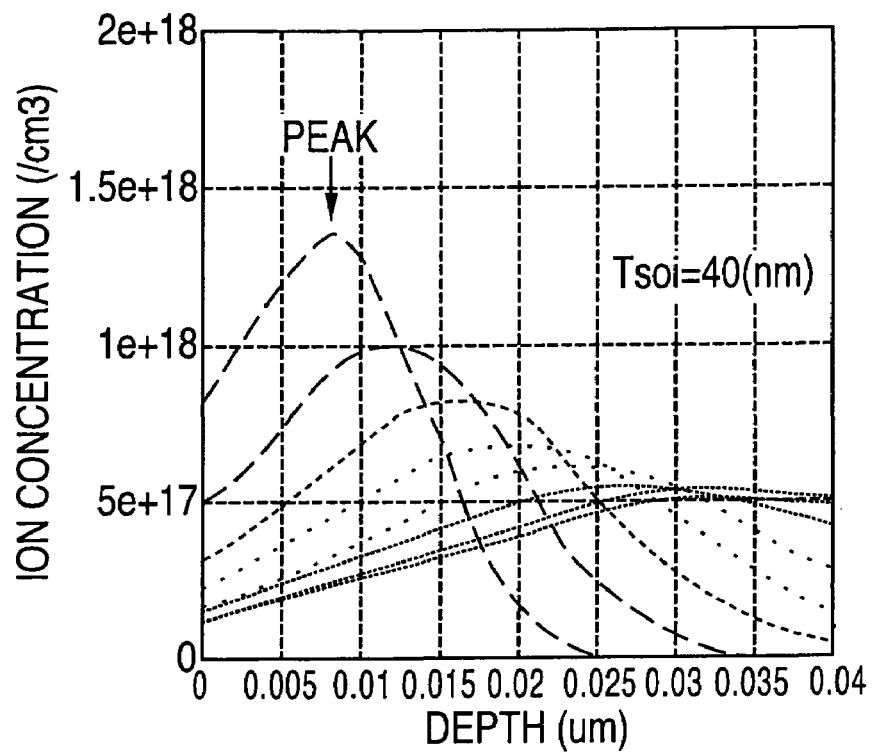
FIGS. 6(a) and 6(b) show the results of a simulation depicting the relationship between the peak ion concentration and a reduction in the threshold voltage.
Figure 6B:
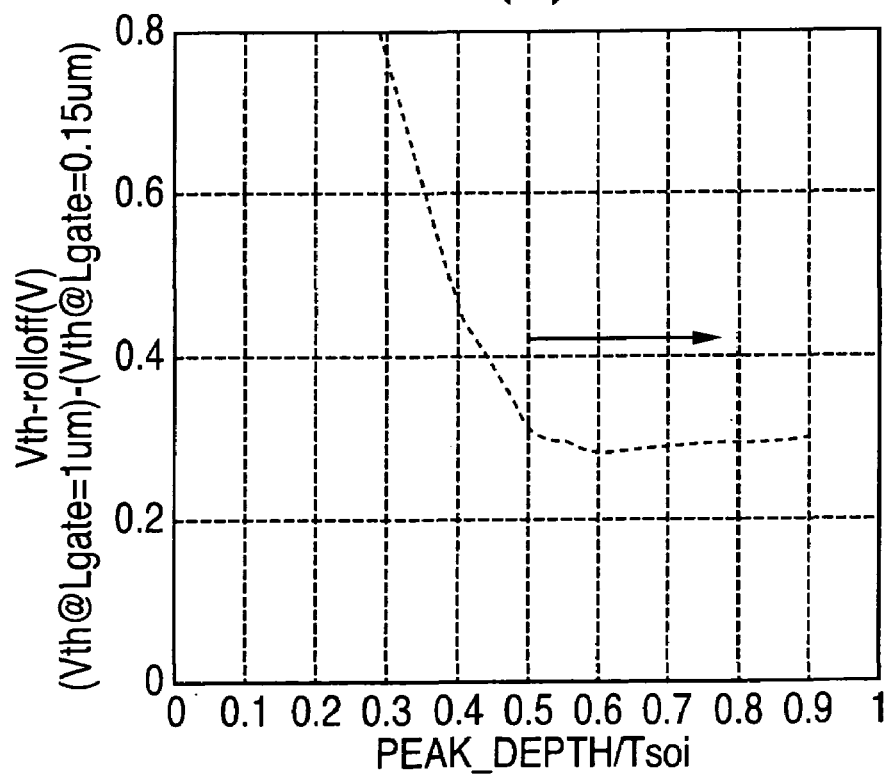

FIGS. 6(a) and 6(b) are results of a simulation showing a relationship between the peak ion concentration and the reduction in the threshold voltage Vth (Vth-rolloff). FIG. 6(a) is the results of the simulation of a plurality of different peak ion concentrations into the SOI layer 104, which is 40 nm (0.04 μm) in depth. Each distribution exhibits the same threshold voltage Vth@Lgate=1 μm when a gate length of the SOI-MOSFET is 1 μm (a long channel). Consequently, the simulation of FIG. 6(a) can accurately to compare a short channel effect (the reduction in the threshold voltage Vth (Vth-rolloff)), when the gate length of the SOI-MOSFET is short (a short channel).

The threshold voltage Vth@Lgate=0.15 μm is calculated when the gate length of the SOI-MOSFET is 0.15 μm (a short channel). In this simulation, a difference between the threshold voltage Vth@Lgate=1 μm and the threshold voltage Vth@Lgate=0.15 μm is defined as the reduction in the threshold voltage Vth (Vth-rolloff). Then, the relationship between the reduction in the threshold voltage Vth (Vth-rolloff) and the peak ion concentration depth within the SOI layer 104 is shown in FIG. 6(b). As shown, the reduction in the threshold voltage Vth (Vth-rolloff) is substantial when the peak ion concentration is located at a more shallow depth than the intermediate horizontal plane 109 (½ Tsoi) of the SOI layer 104 (0<0.5), and is inhibited when the peak ion concentration is located at or below the intermediate horizontal plane 109 (½ Tsoi) of the SOI layer 104 (0.5=<1).

Figure 7A:
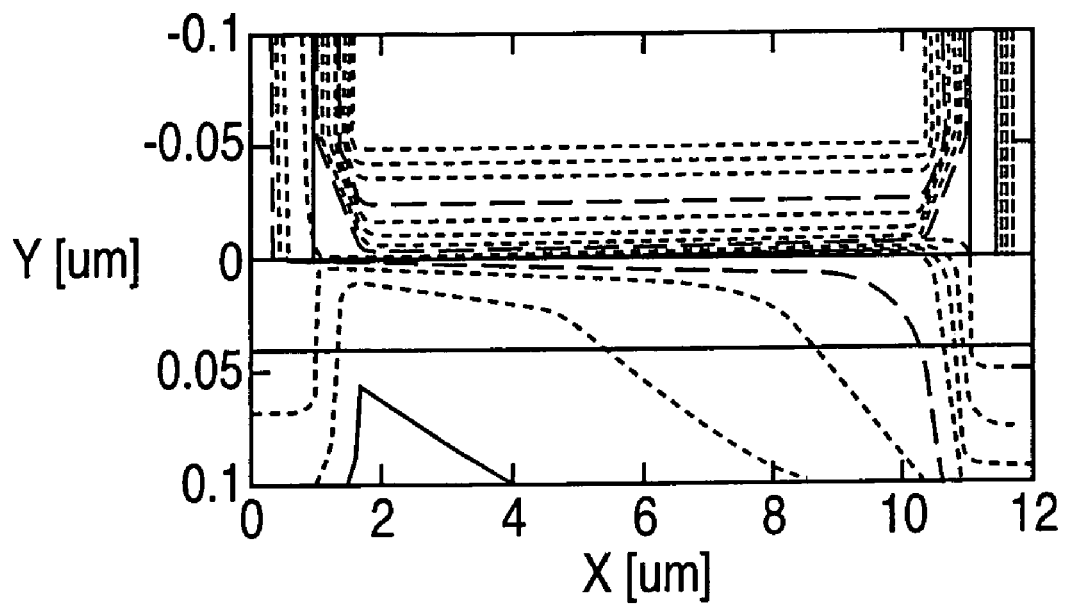
FIGS. 7(a) and 7(b) are diagrams showing potential distributions of the SOI-MOSFET.
Figure 7B:
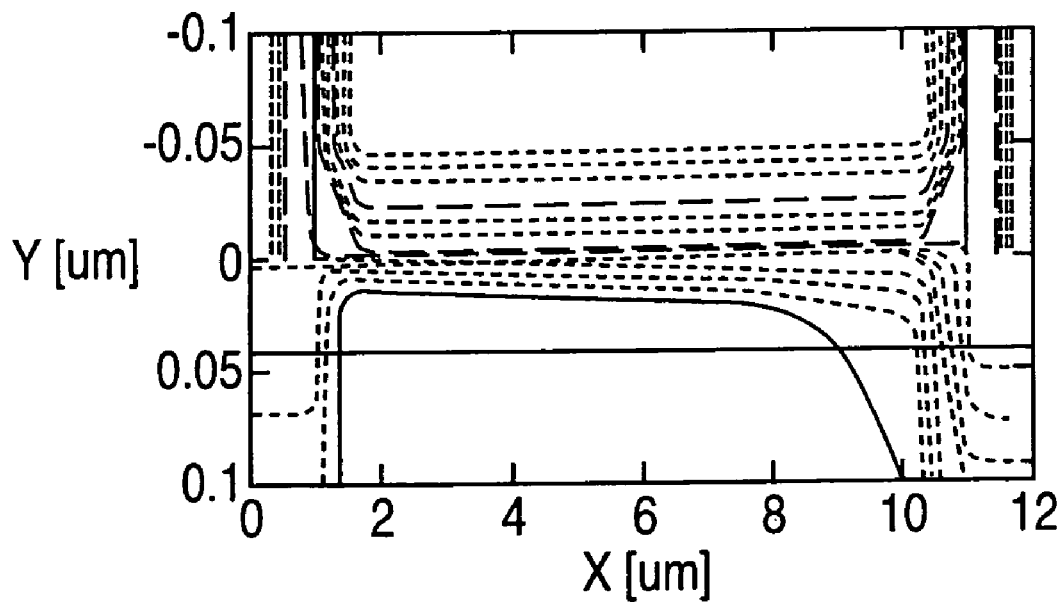

FIGS. 7(a) and 7(b) illustrate potential distributions of the SOI-MOSFET. FIG. 7(a) shows the potential distribution of the SOI-MOSFET which is manufactured by the Process A in which the peak ion concentration is located near the top surface 107 of the SOI layer 104. FIG. 7(b) shows the potential distribution of the SOI-MOSFET which is manufactured by the Process B in which the peak ion concentration is located at or between the intermediate horizontal plane 109 (½ Tsoi) and the bottom surface 111 (Tsoi) of the SOI layer 104. A gate voltage Vg of the SOI-MOSFET is substantially the same as the threshold voltage Vth (Vg≈Vth). A drain region of the SOI-MOSFET is connected to a voltage supply.

As shown in FIG. 7(a), a potential barrier of the SOI-MOSFET manufactured by the Process A falls substantially from the drain region side due to a voltage which is impressed by the voltage supply. On the other hand, as shown in FIG. 7(b), the potential barrier of the SOI-MOSFET manufactured by the Process B falls only slightly from the drain region side due to the voltage which is impressed by the voltage supply. Thus, the falling of the potential barrier of the SOI-MOSFET manufactured by the Process B is smaller than that of the Process A That is, the potential barrier of the SOI-MOSFET falls to a much lesser extend when the peak ion concentration is between the intermediate horizontal plane 109 (½Tsoi) and the bottom surface 111 (Tsoi) of the SOI layer 104.

According to the first preferred embodiment of the present invention, since the distribution of the ion concentration is set such that the peak ion concentration is located at or between the intermediate horizontal plane 109 (½ Tsoi) and the bottom surface 111 (Tsoi) of the SOI layer 104, the reduction in the potential barrier can be effectively inhibited. Therefore, the method of the first preferred embodiment can effectively inhibit the short channel effect resulting from a reduction in the gate length attendant with miniaturization of the SOI-MOSFET.

Figure 8A:
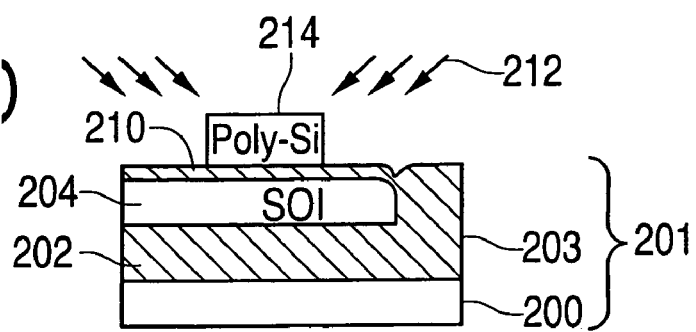
FIGS. 8(a) and 8(b) are cross-sectional views for explaining a method of manufacturing a semiconductor device according to a second preferred embodiment of the present invention.
Figure 8B:
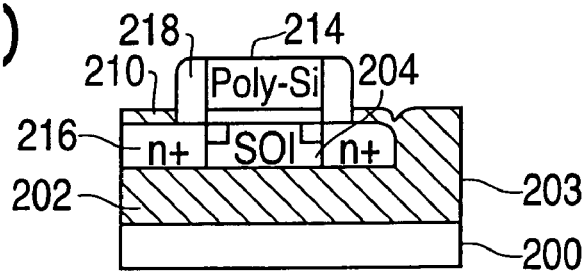
Figure 9:
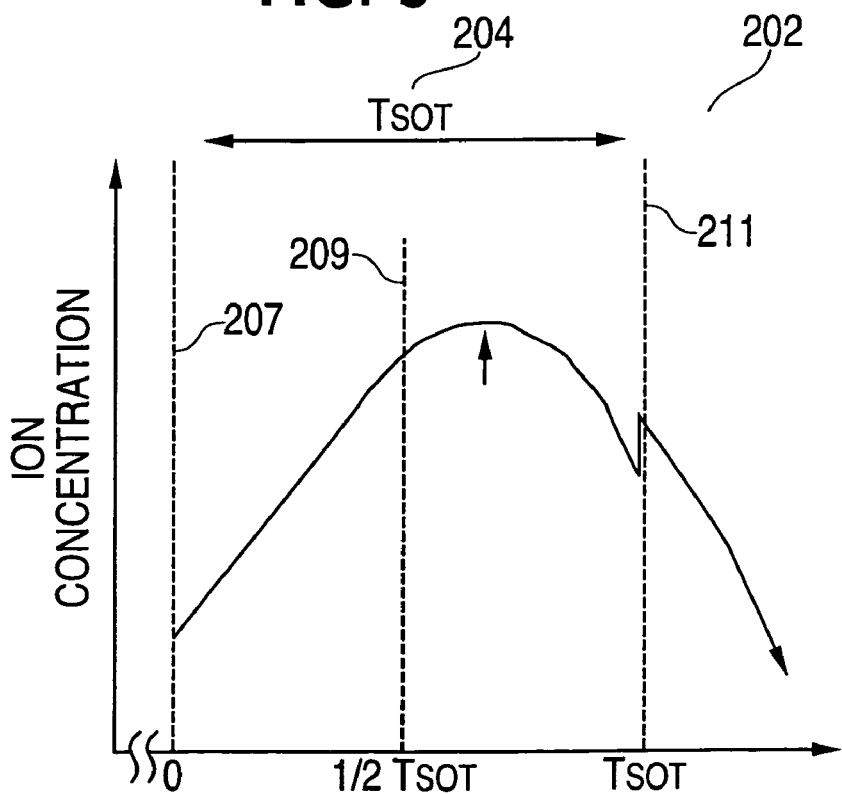
FIG. 9 is a diagram for explaining a distribution of an ion concentration according to the second preferred embodiment.

FIGS. 8(a) and 8(b) are cross-sectional views describing a method of manufacturing a semiconductor device according to a second preferred embodiment of the present invention. FIG. 9 is a diagram showing a distribution of an ion concentration when impurity ions 212 are implanted into an SOI layer 204. The second preferred embodiment includes the same process steps as shown in FIGS. 1(a) through 1(f) of the first preferred embodiment.

After a thin oxide film 210 is formed on the SOI layer 204 (similar to FIG. 1(f)), a gate electrode 214 is formed on the thin oxide film 210. Then, the impurity ions 212 are implanted into the SOI layer 204 by a pocket ion-implantation, as shown in FIG. 8(a). The impurity ions 212 are implanted from an oblique direction which is set at a predetermined angle relative to an SOI substrate 201. Similar to the first preferred embodiment, a distribution of an ion concentration of the impurity ions 212 implanted into the SOI layer 204 is set such that a peak ion concentration is located at or between an intermediate horizontal plane 209 (½ Tsoi) and a bottom surface 211 (Tsoi) of the SOI layer 204, as shown in FIG. 9. A p-type impurity ion is implanted when the SOI-MOSFET is an n-type device, and an n-type impurity ion is implanted when the SOI-MOSFET is a p-type device.

Figure 10:
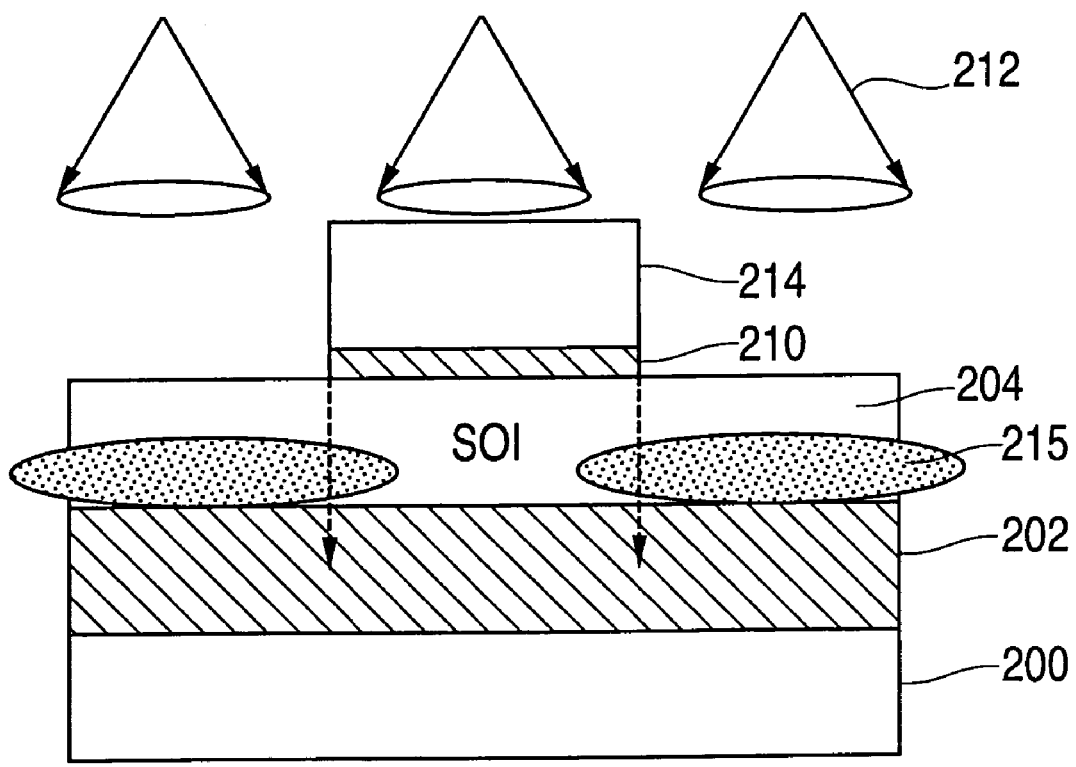
FIG. 10 is a cross-sectional view for explaining a pocket ion-implantation.

FIG. 10 is a cross-sectional view for explaining a pocket ion-implantation. As shown in FIG. 10, impurity regions 215 are formed as pockets by the ion-implantation. An ion-implantation angle of the impurity ion 212 is properly changeable in accordance with the various process conditions.

As shown in FIG. 8(b), lightly doped drain (LDD) regions which include source and drain regions 216 are formed with the use of side walls 218.

Figure 11:
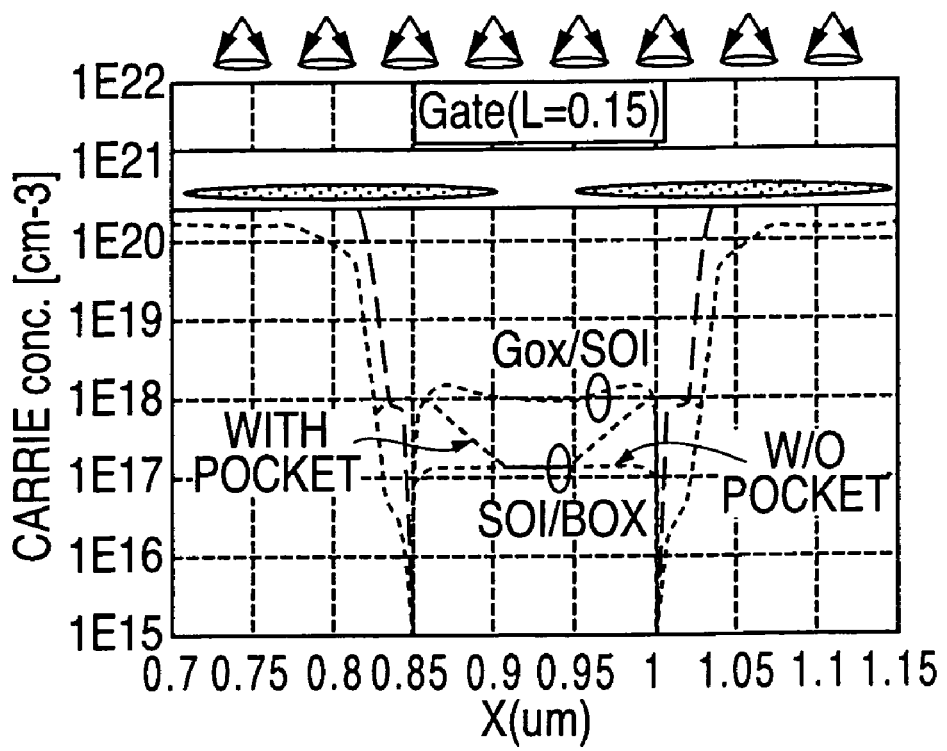
FIG. 11 is a diagram showing distributions of the ion concentration when the pocket ion-implantation is performed to achieve the pockets as shown in FIG. 10, and when such pocket ion-implantation is not performed (i.e., the pockets as shown in FIG. 10 are not formed), respectively.

FIG. 11 is a diagram showing distributions of the ion concentration when the pocket ion-implantation is performed to achieve the pockets as shown in FIG. 10, and when such pocket ion-implantation is not performed (i.e., the pockets as shown in FIG. 10 are not formed), respectively. The distribution of the ion concentration which is below the gate electrode 214 and near a surface between an oxide film 202 and the SOI layer 204, when the ion-implantation is not performed by the pocket ion-implantation, is a dilute and a substantially homogeneous distribution.

At the same time, the distribution of the ion concentration which is below the gate electrode 214 and near the surface between the oxide film 202 and the SOI layer 204, when the ion-implantation is performed by the pocket ion-implantation, shows that the impurity ion concentration increases around both surfaces between the SOI layer 204 under the gate electrode 214 and the source and drain regions 216. Therefore, the second preferred embodiment of the present invention can effectively inhibit the reduction in the potential barrier which runs from the drain region side.

FIG. 12 is a diagram showing a relationship between the gate length and the threshold voltage when the pocket ion-implantation is performed and is not performed, respectively. The reduction in the threshold voltage Vth (Vth-rolloff) is not so substantial even though the gate length is narrowed, when the pocket ion-implantation is performed, as shown in FIG. 12. The manufacturing method of the second preferred embodiment can be effectively inhibited the short channel effect even though the gate length is narrowed as a result of miniaturization of the SOI-MOSFET.

According to the second preferred embodiment of the present invention, since the pocket ion-implantation is performed after forming the gate electrode 214, and the distribution of the ion concentration is set such that the peak ion concentration is located between the intermediate horizontal plane 209 (½ Tsoi) and the bottom surface 211 (Tsoi) of the SOI layer 104, the impurity ion concentration can be increased around both surfaces between the SOI layer 104 under the gate electrode 214 and the source and drain region 216. Therefore, the manufacturing method of the second preferred embodiment can effectively inhibit the reduction in the potential barrier which runs from the drain region side. In other words, the short channel effect can be effectively inhibited.

FIGS. 13(a) through 13(d) are cross-sectional views for explaining a method of manufacturing a semiconductor device according to a third preferred embodiment of the present invention. The third preferred embodiment includes the same process steps as shown in FIGS. 1(a) through 1(f) of the first preferred embodiment.

Figure 13A:
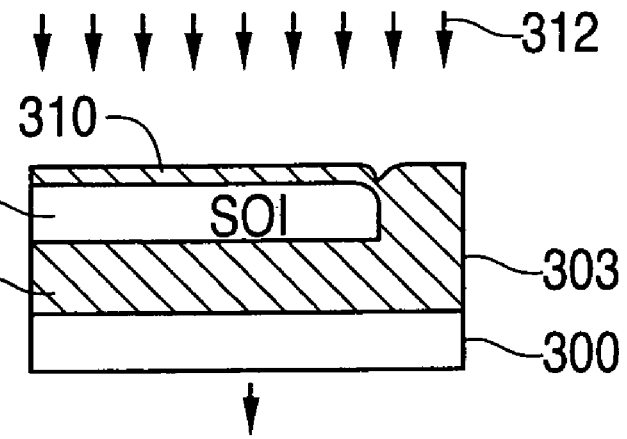
FIGS. 13(a) through 13(d) are cross-sectional views for explaining a method of manufacturing a semiconductor device according to a third preferred embodiment of the present invention.

After a thin oxide film 310 is formed on an SOI layer 304 (similar to FIG. 1(f)), impurity ions 312 are implanted into the SOI layer 304, as shown in FIG. 13(a). A distribution of an ion concentration of the impurity ions 312 implanted into the SOI layer 304 is set such that a peak ion concentration is located between a top surface and an intermediate plane of the SOI layer 304. A p-type impurity ion is implanted when the SOI-MOSFET is an n-type device, and an n-type impurity ion is implanted when the SOI-MOSFET is a p-type device.

Figure 13B:
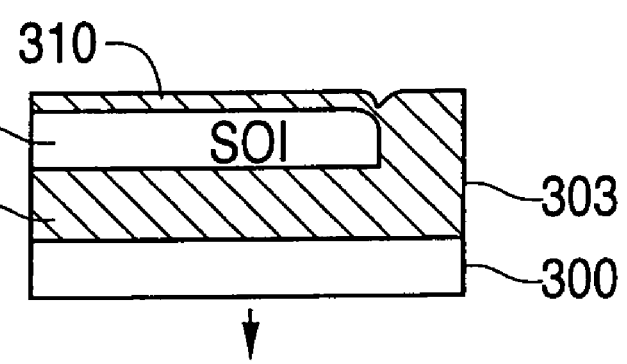
Figure 14:
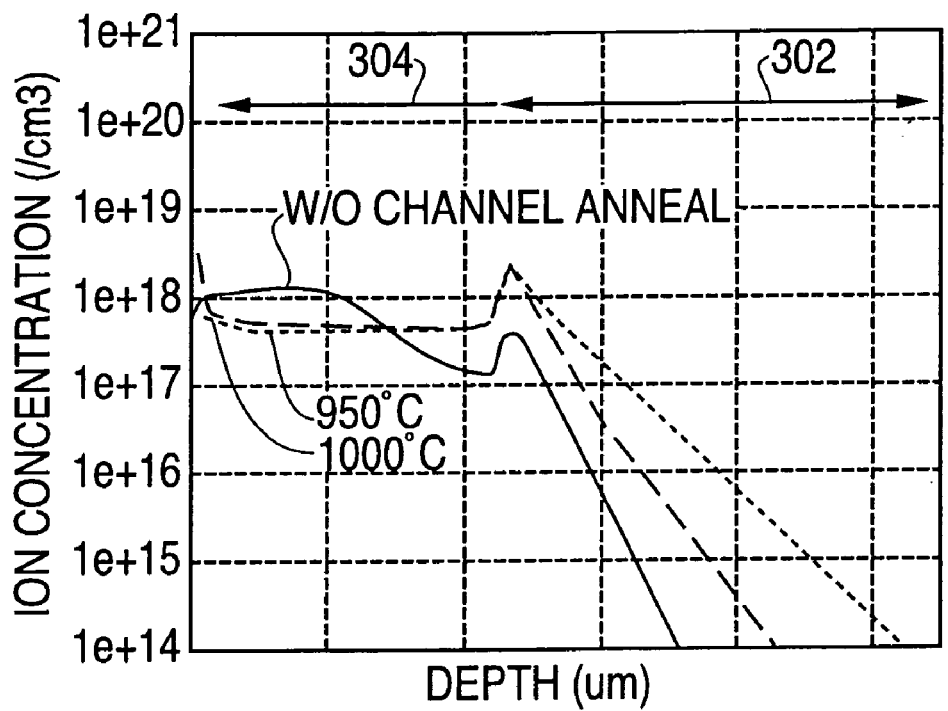
FIG. 14 is a diagram showing distributions of an ion concentration when a heat treatment is performed and is not performed, respectively.

Then, a heat treatment is carried out, as shown in FIG. 13(b). The heat treatment may be conducted at a temperature range of 950° C.~1000° C., and in an inert (ex. Nitrogen gas $N_2$) atmosphere or in a vacuum atmosphere. The heat treatment causes the impurity ions 312 to diffuse into a deep region of the SOI layer 304. In detail, the impurity ions 312 are diffused to achieve a substantially homogeneous ion distribution a described below (FIG. 14). This heat treatment is called a channel anneal.

FIG. 14 is a diagram showing distributions of the ion concentration when the heat treatment is performed and is not performed, respectively. Due to a diffusion of the impurity ions 312 by the heat treatment after the ion-implantation, the impurity ion concentration of the SOI layer 304 becomes substantially homogeneous, as shown in FIG. 14.

Figure 15:
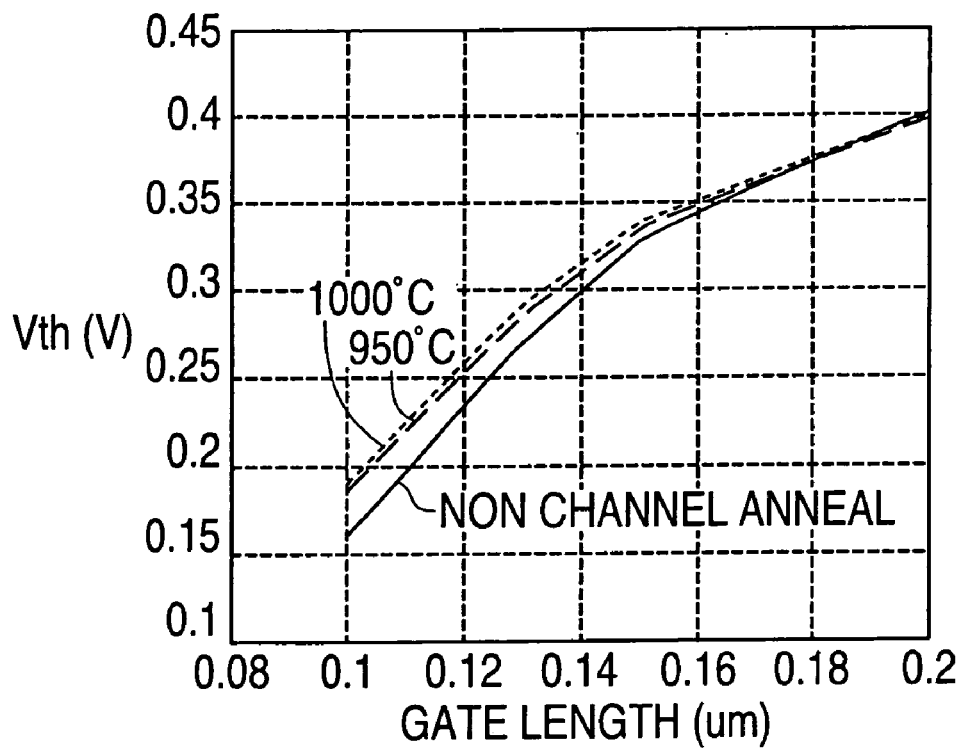
FIG. 15 is a diagram showing relationships between a gate length and a threshold voltage when the heat treatment is performed and is not performed, respectively.

FIG. 15 is a diagram showing a relationship between the gate length and the threshold voltage when the heat treatment is performed and is not performed after the ion-implantation, respectively. As shown in FIG. 15, when the heat treatment is performed after the implantation of the impurity ions 312, the reduction in the threshold voltage Vth (Vth-rolloff) is not as substantial as the gate length is reduced. The manufacturing method of the third preferred embodiment can effectively inhibit the short channel effect resulting from miniaturization of the SOI-MOSFET.

Figure 13C:
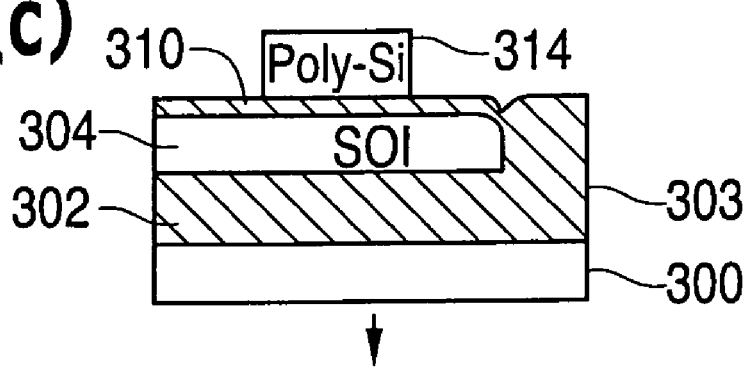
Figure 13D:
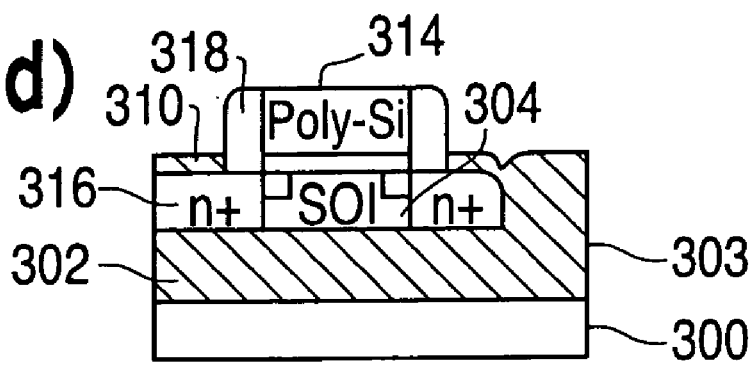

As shown in FIG. 13(c), a gate electrode is formed on the thin oxide film 310. Then, the lightly doped drain (LDD) regions which include source and drain regions 316 are formed using side walls 318, as shown in FIG. 13(d).

According to the preferred third embodiment of the present invention, since the heat treatment allows for the impurity ion concentration of the deep region of the SOI layer 304 to be increased and the impurity ion concentration of the SOI layer 304 to be made the substantially homogeneous, the reduction in the potential barrier which runs from the drain region side can be effectively inhibited. Therefore, the manufacturing method of the third preferred embodiment can effectively inhibit the short channel effect.

While the third preferred embodiment of the present invention presents an example in which the heat treatment is conducted at the temperature range of 950° C.~1000° C. after the ion-implantation, the invention is not limited to this range, and a temperature in excess of 850° C. is usually sufficient to achieve the desired dispersion.

Further, while the third preferred embodiment of the present invention presents an example in which the nitrogen N2 atmosphere is used for the heat treatment, the present invention is not limited to this example and other inert gas atmospheres (ex. Argon Ar and Helium He) may be used.

Figure 16A:
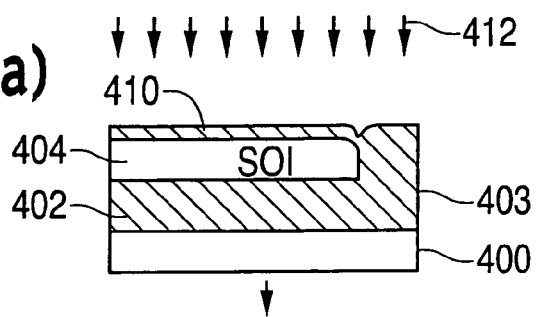
FIGS. 16(a) through 16(c) are cross-sectional views for explaining a method of manufacturing a semiconductor device according to a fourth preferred embodiment of the present invention.
Figure 16B:
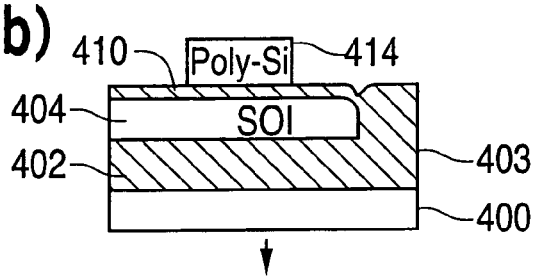
Figure 16C:
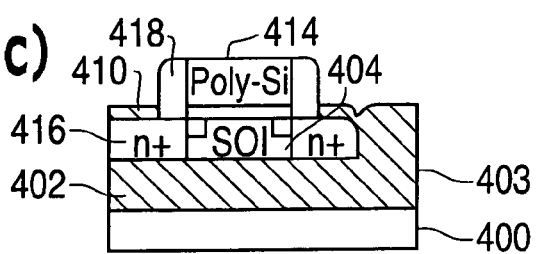

FIG. 16(a) through 16(c) are cross-sectional views for explaining a method of manufacturing a semiconductor device according to a fourth preferred embodiment of the present invention. The fourth preferred embodiment includes the same process steps as shown in FIG. 1(a) through 1(f) of the first preferred embodiment.

Then, impurity ions 412 are implanted into an SOI layer 404, as shown in FIG. 16(a). A p-type impurity ion is implanted when the SOI-MOSFET is an n-type device, and an n-type impurity ion is implanted when the SOI-MOSFET is a p-type device.

The fourth preferred embodiment differs from prior embodiments with respect to the preferred range of a peak ion concentration.

Figure 17:
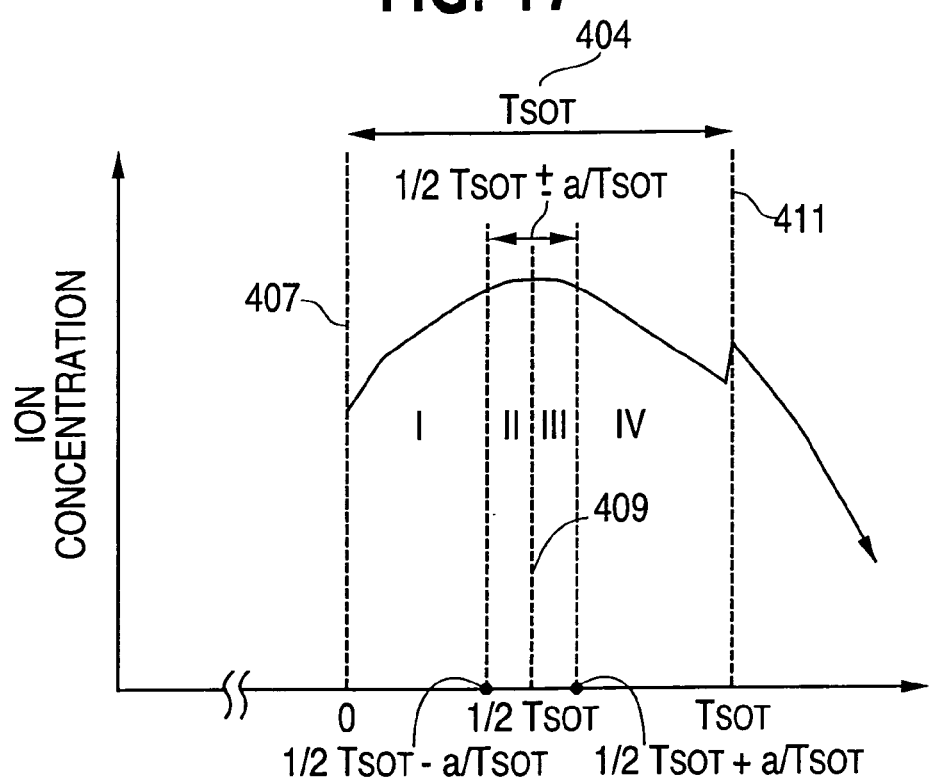
FIG. 17 is a diagram for showing a distribution of an ion concentration according to the third preferred embodiment.

FIG. 17 is a diagram showing a distribution of an ion concentration when impurity ions are implanted into an SOI layer. FIG. 17 shows top and bottom surfaces 407, 411 of the SOI layer 404, an intermediate horizontal plane 409 (½ Tsoi) of the SOI layer 404, and the distribution of the ion concentration. The distribution of the ion concentration is set such that the peak ion concentration is located within a range of ½Tsoi±0.1Tsoi, where Tsoi is a depth of the SOI layer 404, when the impurity ions 412 are implanted into the SOI layer 404.

Then, a gate electrode 414 which is composed of a poly-silicon is formed on a thin oxide film 410, as shown in FIG. 16(b). Finally, lightly doped drain (LDD) regions which include source and drain regions 416 are formed using side walls 418, as shown in FIG. 16(c).

Figure 18A:
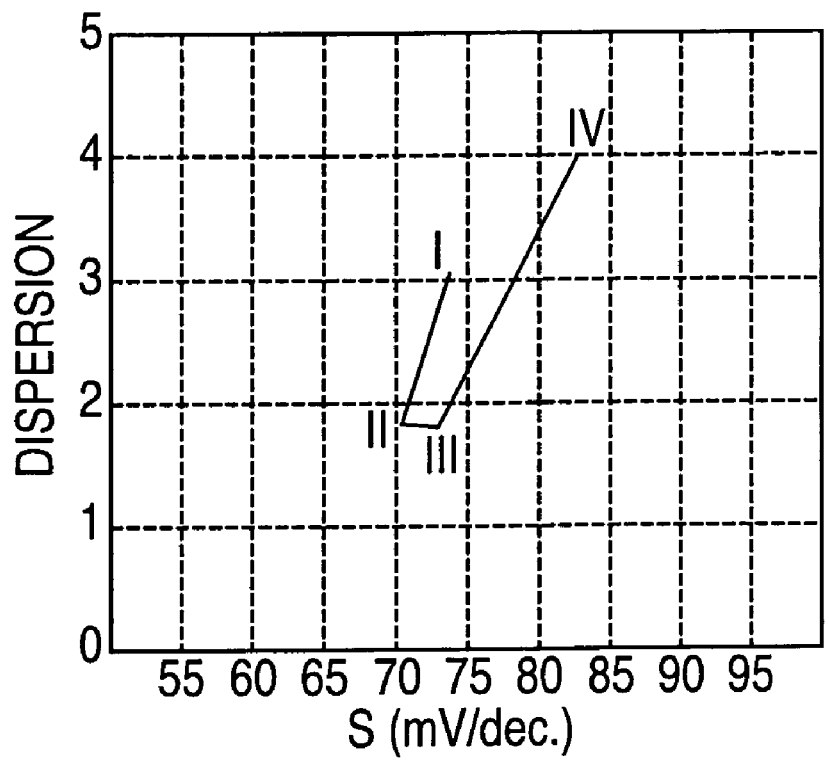
FIGS. 18(a) and 18(b) are diagrams showing a sub-threshold coefficient S and a dispersion of the same for each of four concentration distributions having different peak ion concentrations.
Figure 18B:
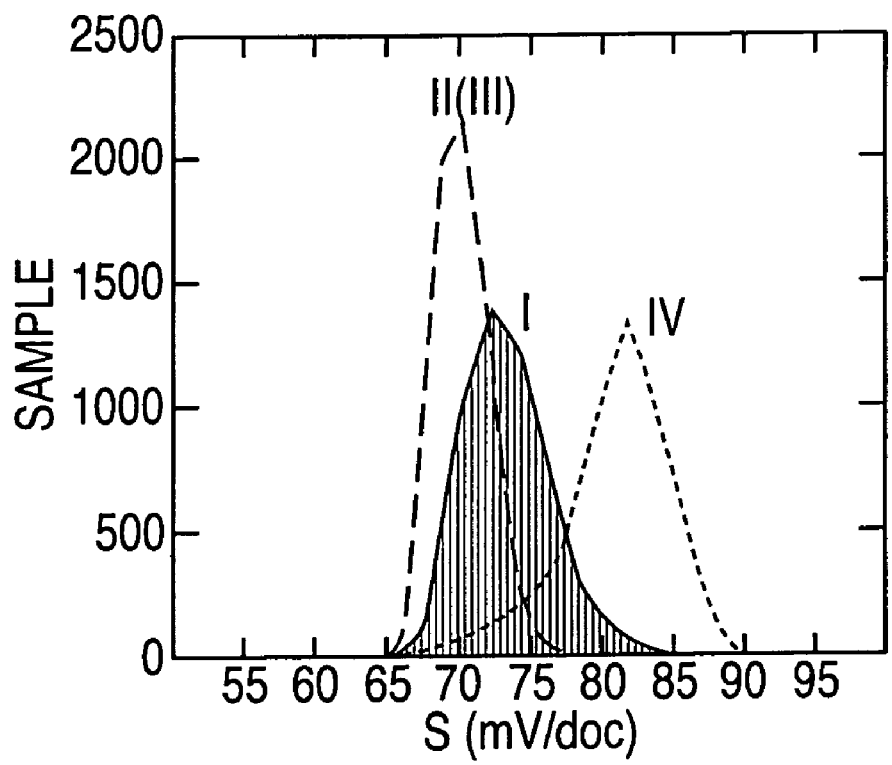
Figure 19A:
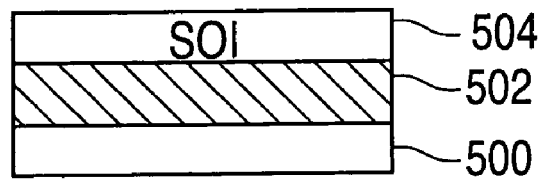
FIGS. 19(a) through 19(f) and FIGS. 20(a) through 20(c) are cross-sectional views for explaining a conventional method of manufacturing a semiconductor device.
Figure 19B:
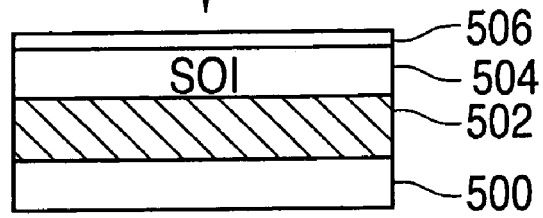
Figure 19C:
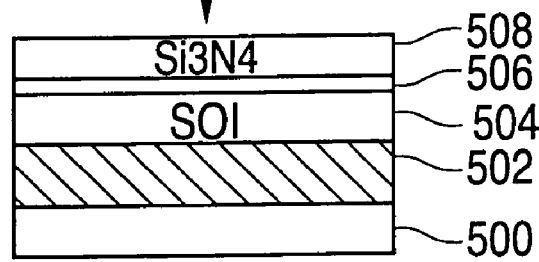
Figure 19D:
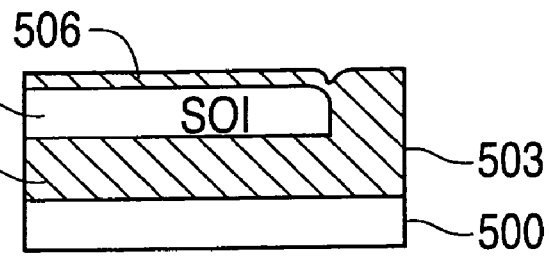
Figure 19E:
Figure 19F:
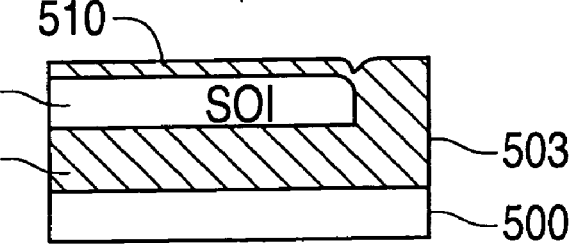
Figure 20A:
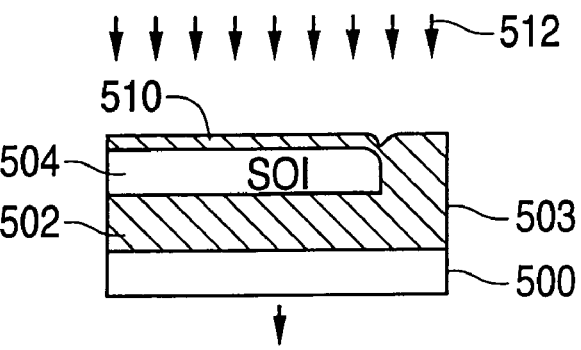
Figure 20B:
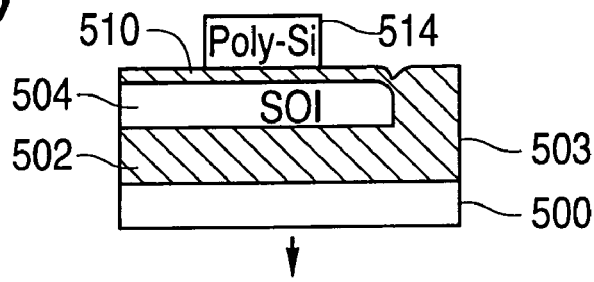
Figure 20C:
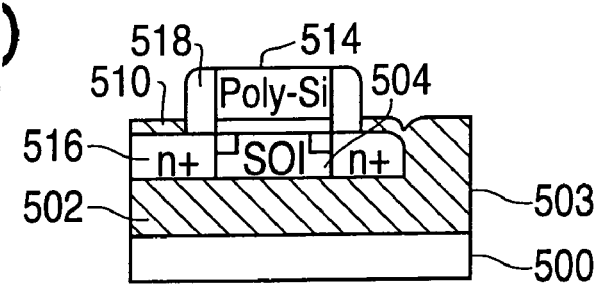
Figure 21:
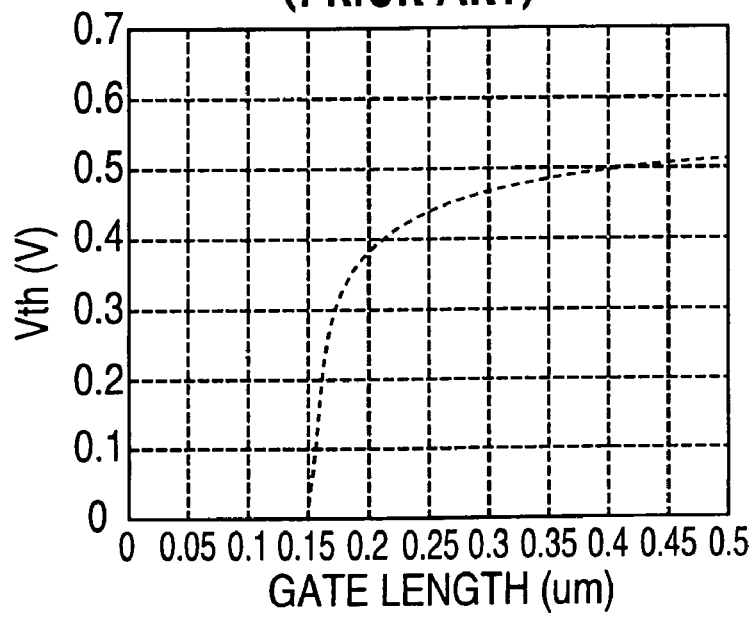
FIG. 21 is a diagram showing a relationship between a gate length and a threshold voltage of a conventional SOI-MOSFET.
Figure 22:
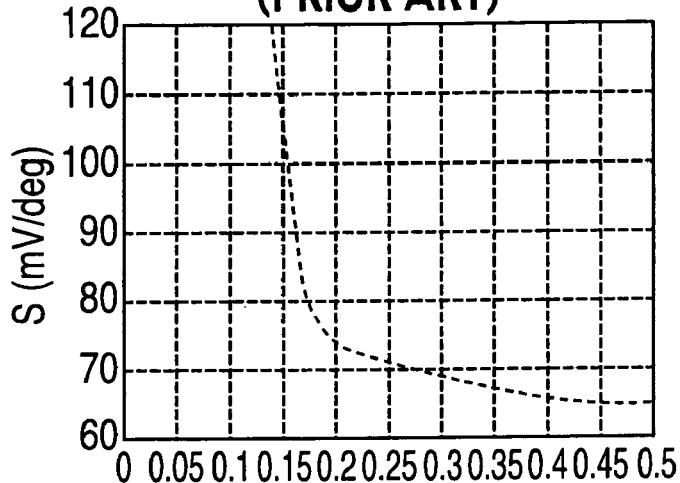
FIG. 22 is a diagram showing a relationship between a gate length and a sub-threshold coefficient of the conventional SOI-MOSFET.
Figure 23A:
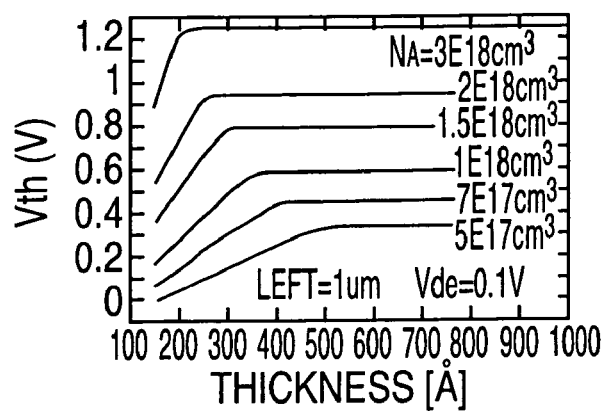
FIGS. 23(a) and 23(b) are diagrams showing relationships between a thickness of an SOI layer and a threshold voltage of the conventional SOI-MOSFET which has different gate lengths.
Figure 23B:
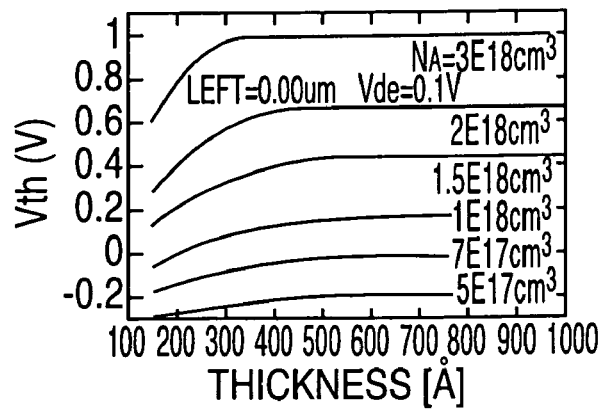

FIG. 18(a) is a diagram showing a relationship between an sub-threshold coefficient S and a dispersion of the same, when the impurity ions are implanted into the SOI layer 404 to achieve four distributions (I, II, III and IV) of the ion concentration having different peak ion concentrations from one another. FIG. 18(b) is a histogram showing a relationship between the sub-threshold coefficient S and the number of samples of the same, when the impurity ions are implanted into the SOI layer 404 according to four distributions (I, II, III and IV) of the ion concentration.

Referring also to FIG. 17, distribution (I) is the case were the peak ion concentration is located at a lesser depth than the preferred range of ½Tsoi–0.1Tsoi (PEAK ION CENCENTRATION<½Tsoi–0.1Tsoi).

Distribution (II) is the case were the peak ion concentration is located at ½Tsoi–0.1Tsoi (PEAK ION CENCENTRATION=½Tsoi–0.1Tsoi.

Distribution (III) is the case were the peak ion concentration is located at ½Tsoi+0.1Tsoi (PEAK ION CENCENTRATION=½Tsoi+0.1Tsoi).

Distribution (IV) is the case were the peak ion concentration is located at a greater depth than the preferred range of ½Tsoi+0.1Tsoi (PEAK ION CONCENTRATION>½Tsoi+0.1Tsoi).

As shown in FIGS. 18(a) and 18(b), the sub-threshold coefficients S of distributions (II) and (III) are smaller than those distributions (I) and (IV). Further, the dispersions of the sub-threshold coefficients S of distributions (II) and (III) are smaller than those distributions (I) and (IV).

The SOI-MOSFET which is formed due to an ion implantation of near the top surface 407 of the SOI layer 404 can not inhibited the reduction in the potential barrier which runs from the drain region, as in distribution (I). Therefore, the sub-threshold coefficient S rises since the threshold voltage Vth falls with a reduction in the gate length.

Since a depletion rate of the SOI layer 404 falls when the impurity ions 412 are implanted into the vicinity of bottom surface 411 of the SOI layer 404, the threshold coefficient S rises and the dispersion of the threshold coefficient S increases as in distribution (IV).

According to the fourth preferred embodiment of the present invention, since the distribution of the ion concentration is set such that the peak ion concentration is located within a range of ½Tsoi±0.1Tsoi, where Tsoi is a depth of the SOI layer 404, a characteristic of the sub-threshold coefficient S and the dispersion of the sub-threshold coefficient S can be optimized. Moreover, since the reduction in the potential barrier which runs from the drain region can be effectively inhibited, the method of the fourth preferred embodiment can effectively inhibit the short channel effect caused by reduction the gate length attendant with miniaturization of the SOI-MOSFET.

As described above, the method of manufacturing semiconductor device and the semiconductor device according to the present invention can effectively inhibit the reduction in the potential barrier which runs from the drain region. Therefore, the method and device of the present invention can effectively inhibit the short channel effect resulting from a reduction in the gate length attendant with miniaturization of the SOI-MOSFET.

The present invention has been described with reference to illustrative embodiments, however, this invention must not be considered to be confined only to the embodiments illustrated. Various modifications and changes of these illustrative embodiments and the other embodiments of the present invention will become apparent to those skilled in the art with reference to the description of the present invention. It is therefore contemplated that the appended claims will cover any such modifications or embodiments as fall within the true scope of the invention.

What is claimed is:

1. A semiconductor device, comprising:
a silicon-on-insulator (SOI) substrate which includes a silicon substrate having an upper surface, a first insulating layer having a lower surface extending horizontally over the upper surface of the silicon substrate, and a silicon layer having a lower surface extending horizontally over an upper surface of the first insulating layer and a peak ion concentration along a vertical depth of the silicon layer which is located between an intermediate horizontal plane of the silicon layer and the lower surface of the silicon layer inclusive, wherein the intermediate horizontal plane extends horizontally within the silicon layer at half a vertical depth of the silicon layer;
a second insulating layer formed over an upper surface of the silicon layer of the SOI substrate; and
a gate electrode formed over the second insulating layer.

2. The semiconductor device according to claim 1, wherein an ion concentration of the silicon layer is substantially homogeneous along the vertical depth of the silicon layer.

3. A semiconductor device, comprising:
a silicon-on-insulator (SOI) substrate which includes a silicon substrate having an upper surface, a first insulating layer having a lower surface extending horizontally over the upper surface of the silicon substrate, and a silicon layer having a lower surface extending horizontally over an upper surface of the first insulating layer and a peak ion concentration along a vertical depth of the silicon layer which is located at the vertical depth ½ Tsoi±0.1 Tsoi of the silicon layer, where Tsoi is an entire vertical depth of the silicon layer;
a second insulating layer formed over an upper surface of the silicon layer of the SOI substrate; and
a gate electrode formed over the second insulating layer.

* * * * *